United States Patent
Shim et al.

(10) Patent No.: US 8,141,922 B2
(45) Date of Patent: Mar. 27, 2012

(54) PICK-AND-PLACE APPARATUS

(75) Inventors: Jae-Gyun Shim, Suwon-si (KR); Yun-Sung Na, Cheunan-si (KR); In-Gu Jeon, Suwon-si (KR); Dong Hyun Yo, Bucheon Si (KR)

(73) Assignee: TechWing Co., Ltd, Hwaseung-si (KR)

( * ) Notice: Subject to any disclaimer, the term of this patent is extended or adjusted under 35 U.S.C. 154(b) by 470 days.

(21) Appl. No.: 12/304,718

(22) PCT Filed: Jun. 26, 2007

(86) PCT No.: PCT/KR2007/003094
§ 371 (c)(1),
(2), (4) Date: Dec. 12, 2008

(87) PCT Pub. No.: WO2008/004778
PCT Pub. Date: Jan. 10, 2008

(65) Prior Publication Data
US 2009/0297301 A1    Dec. 3, 2009

(30) Foreign Application Priority Data

Jul. 1, 2006  (KR) .................. 10-2006-0061716

(51) Int. Cl.
*H01L 21/673* (2006.01)
*B66C 1/02* (2006.01)

(52) U.S. Cl. .......................... 294/87.1; 294/65

(58) Field of Classification Search ............... 294/65, 294/87.1, 183; 414/222.01, 752.1; 198/468.3, 198/468.4
See application file for complete search history.

(56) References Cited

U.S. PATENT DOCUMENTS

| 5,273,152 | A  | * | 12/1993 | Brun | 198/468.3 |
|---|---|---|---|---|---|
| 6,068,317 | A  | * | 5/2000 | Park | 294/87.1 |
| 6,346,682 | B2 | * | 2/2002 | Kim et al. | 209/573 |
| 7,023,197 | B2 | * | 4/2006 | Jung | 324/757.01 |
| 7,464,807 | B2 | * | 12/2008 | Ham et al. | 198/468.3 |
| 2008/0284186 | A1 | * | 11/2008 | Shim et al. | 294/87.1 |

FOREIGN PATENT DOCUMENTS

| KR | 20-2000-0002851 U | 2/2000 |
|---|---|---|
| KR | 10-2003-0008644 A1 | 1/2003 |
| WO | 2005-062375 A1 | 7/2005 |

* cited by examiner

*Primary Examiner* — Paul T Chin
(74) *Attorney, Agent, or Firm* — Jefferson IP Law, LLP

(57) ABSTRACT

A pick-and-place apparatus for transferring and loading semiconductor devices between first and second loading elements is provided. The pick-and-place apparatus includes a multiplicity of picking unit modules, each of which has at least one or more picking units, and an interval regulation apparatus for regulating intervals between the picking unit modules at the first to third modes. The first to third row interval values are different from each other. The intervals between the picking unit modules are all regulated to be identical to the first row interval at the first mode, are alternately regulated to the second row interval and the third row interval in turn at the second mode, and are alternately regulated to the third row interval and the second row interval in turn at the third mode.

6 Claims, 13 Drawing Sheets

[Fig. 1]
(a)
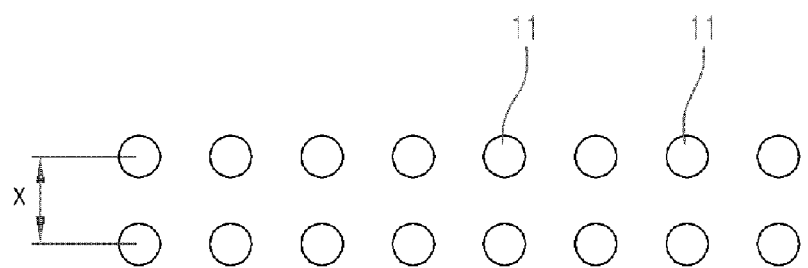
(b)
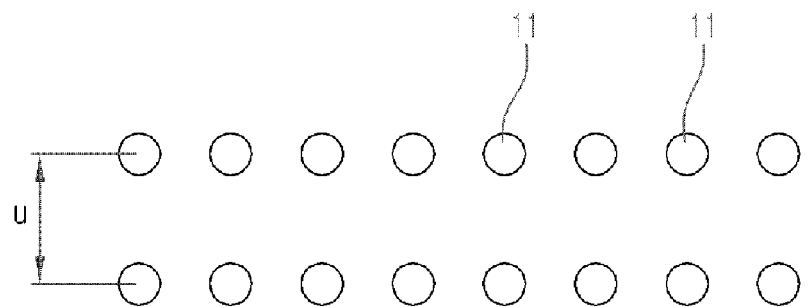

[Fig. 2]
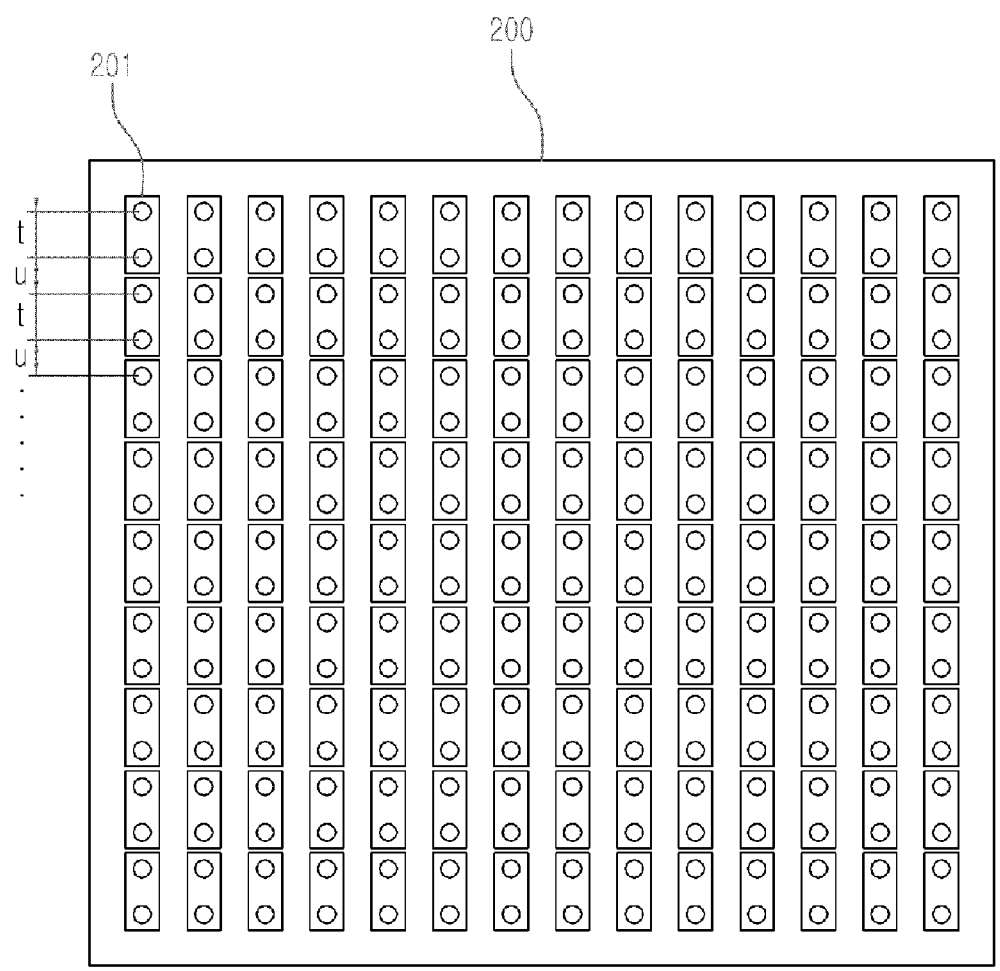

[Fig. 3]
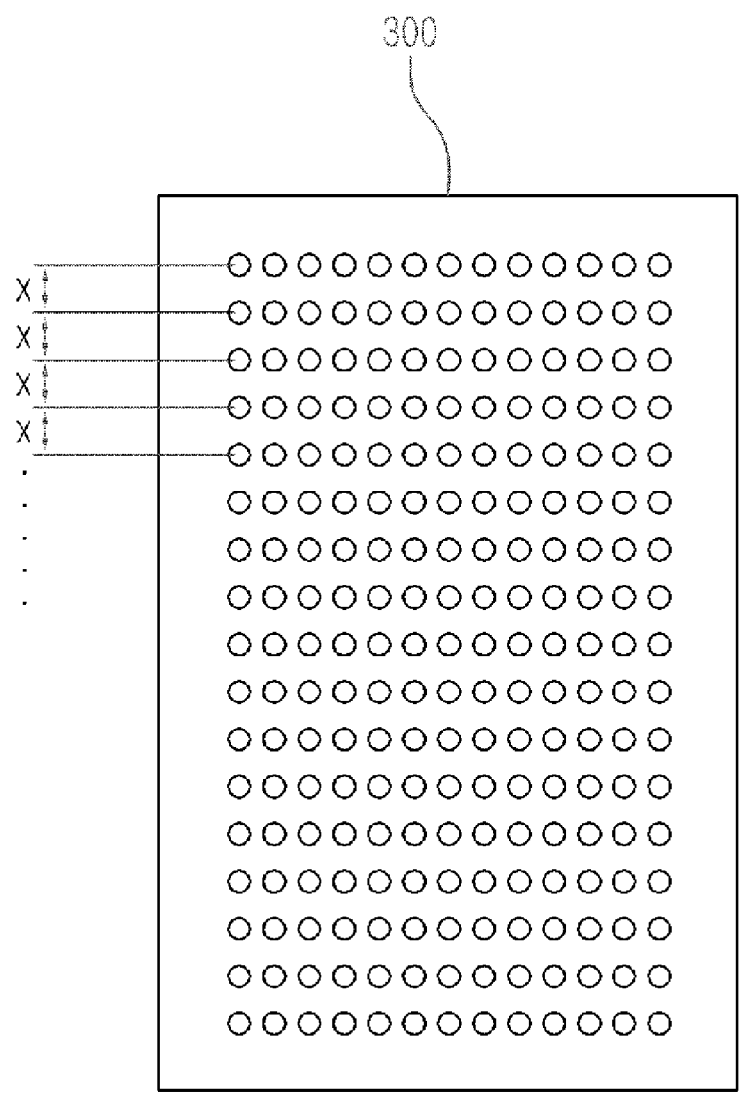

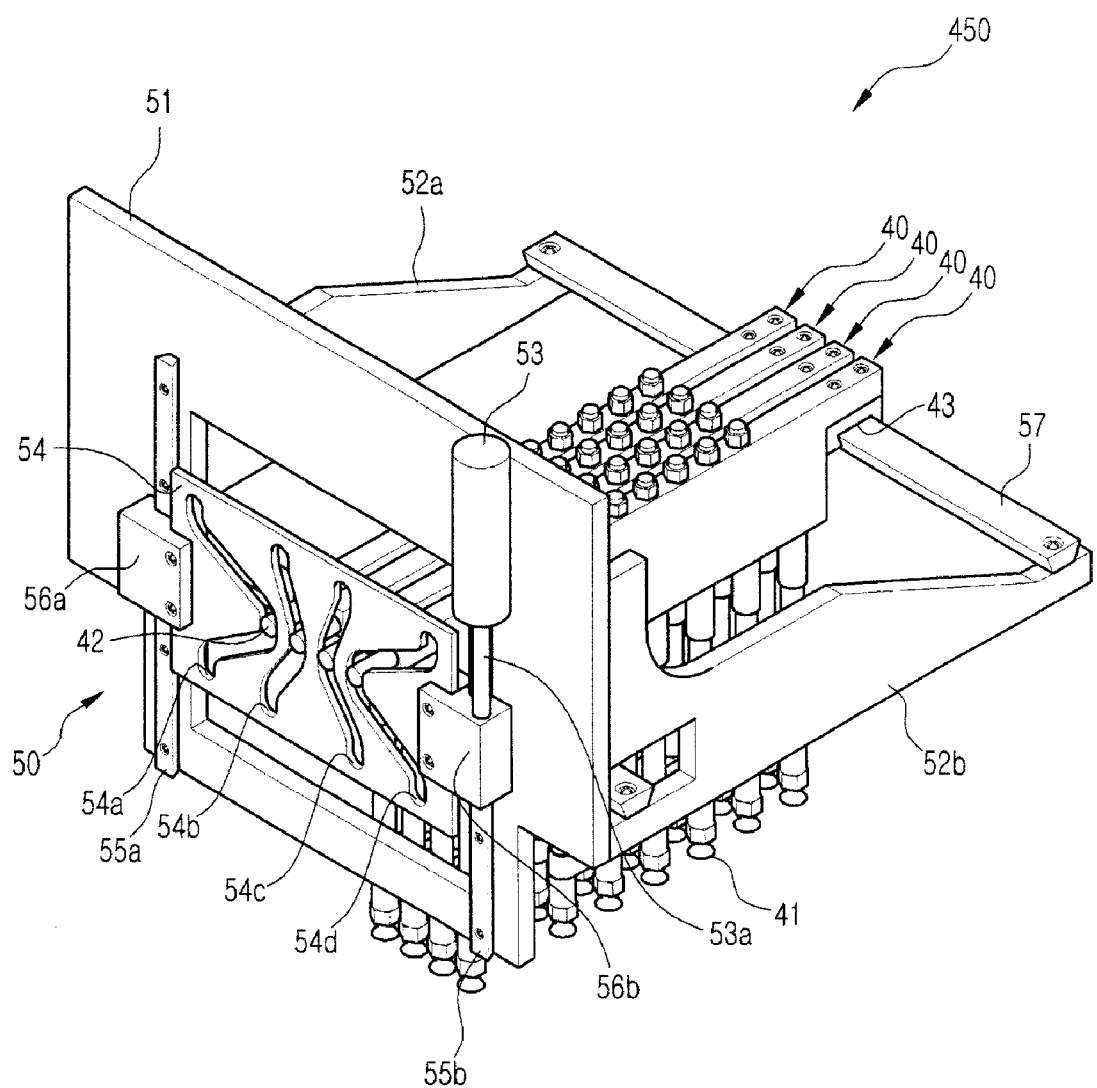
[Fig. 4]

[Fig. 5]
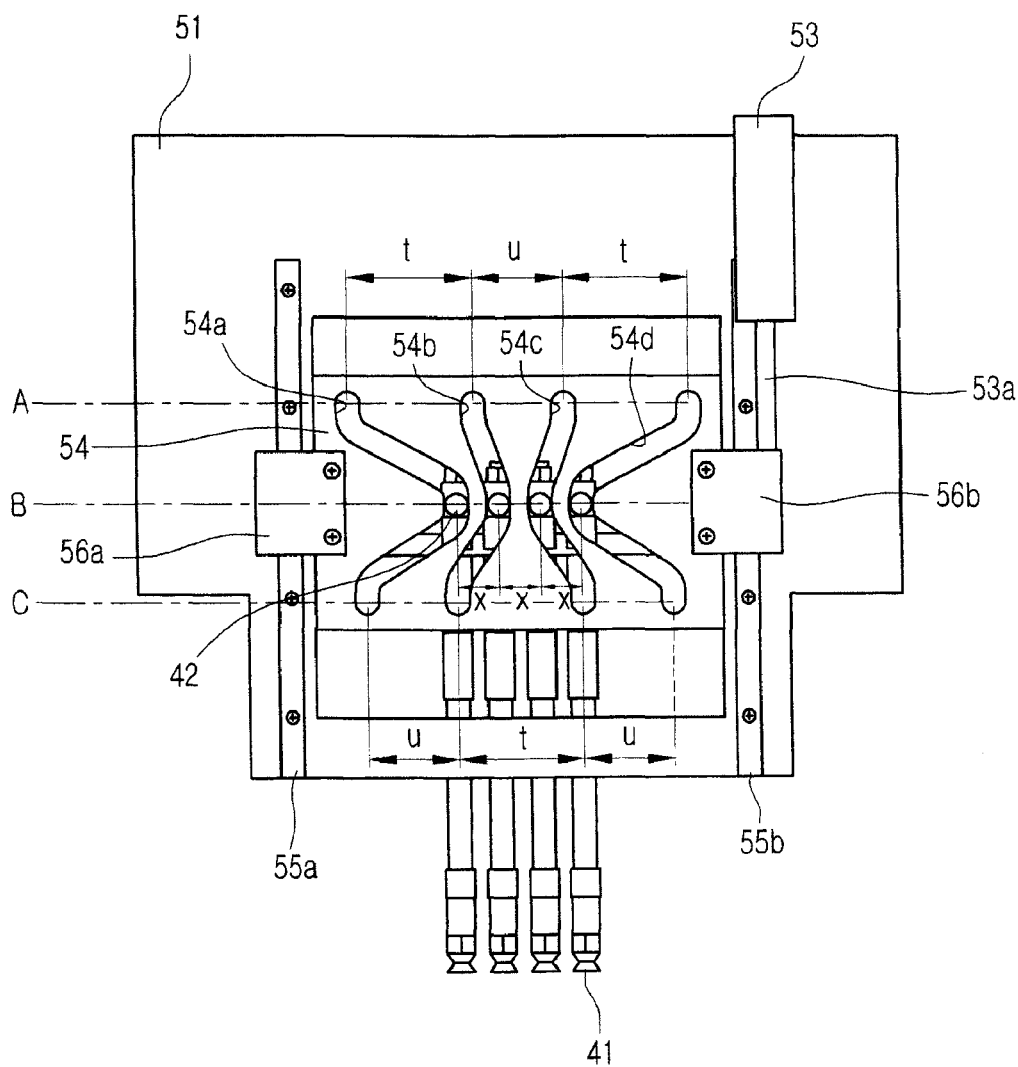

[Fig. 6]
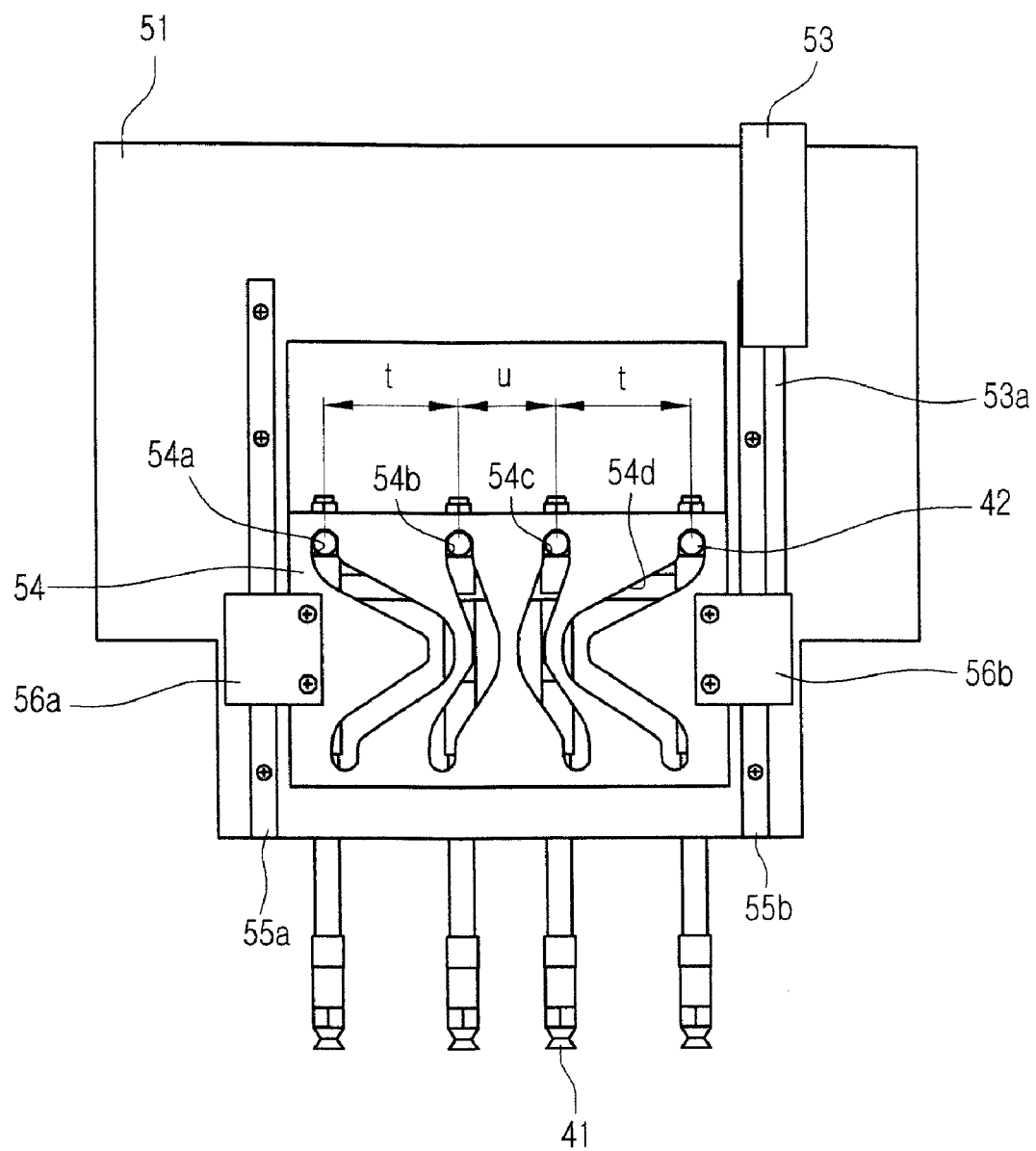

[Fig. 7]
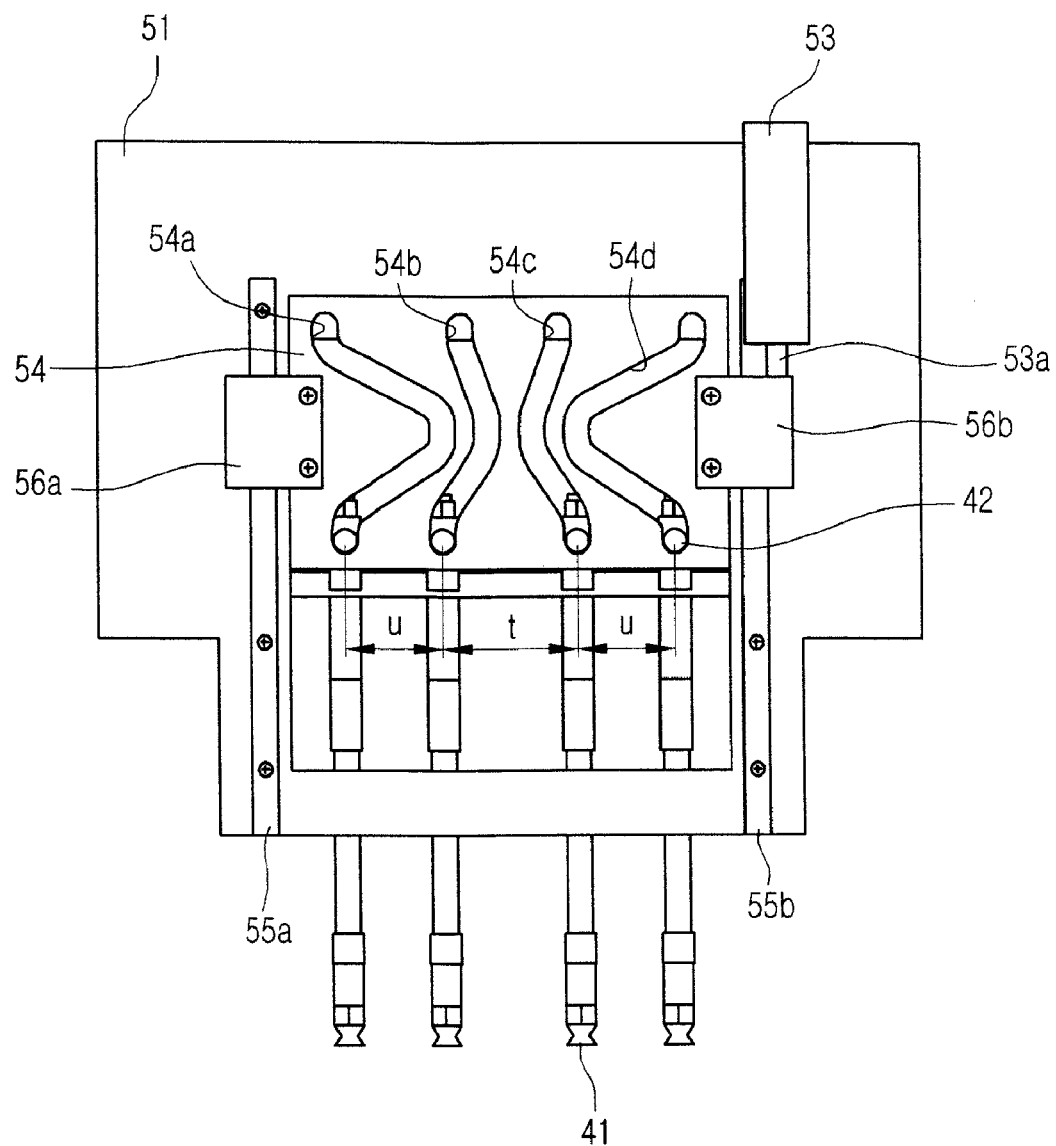

[Fig. 8]
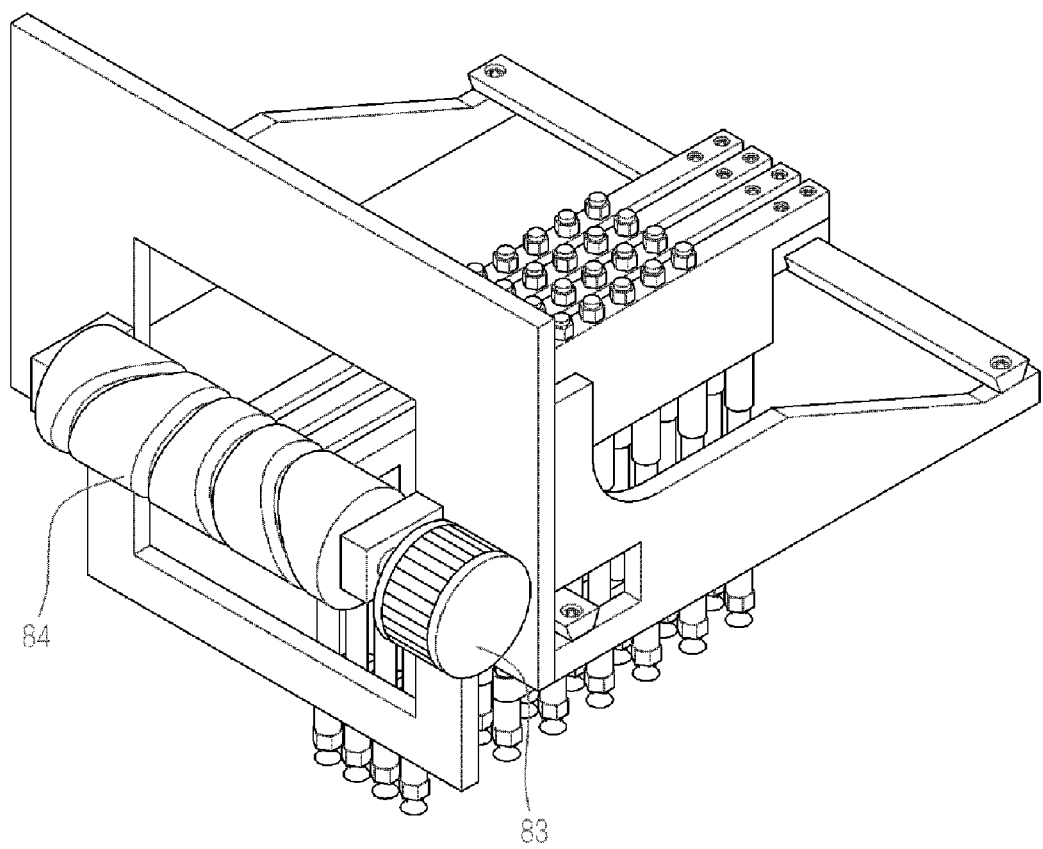

[Fig. 9]
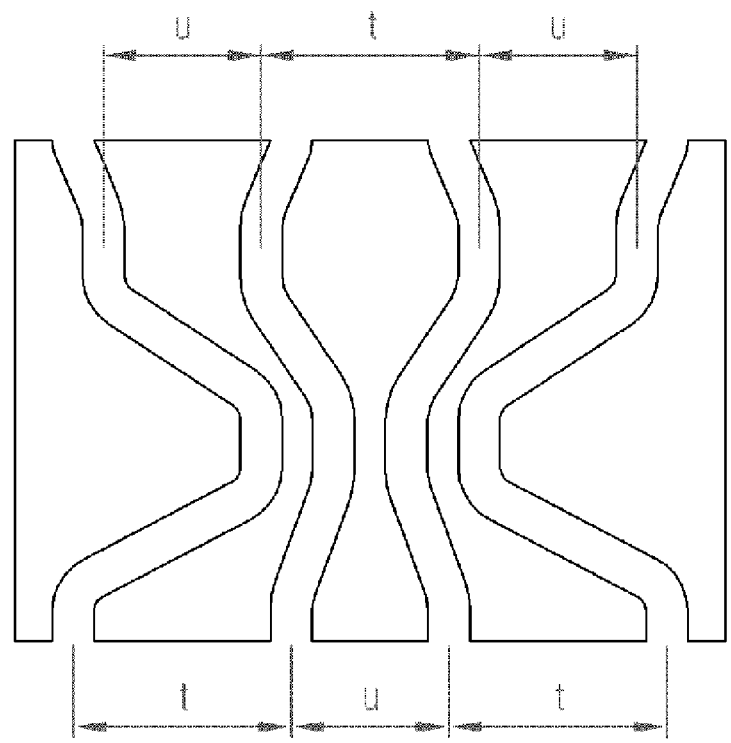

[Fig. 10]
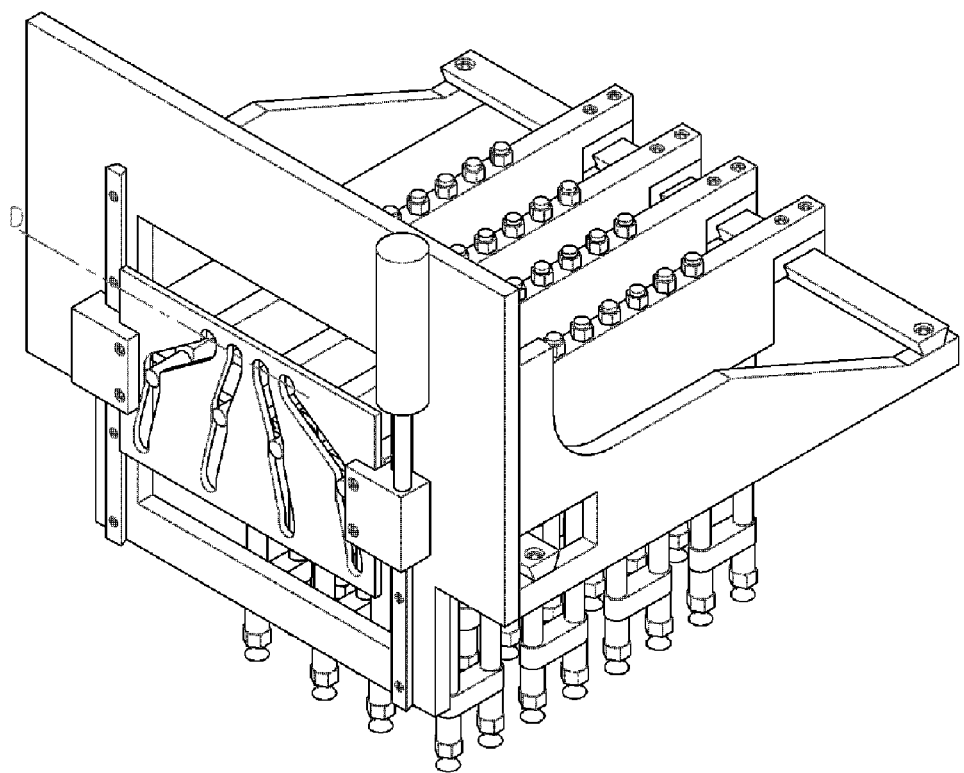

[Fig. 11]
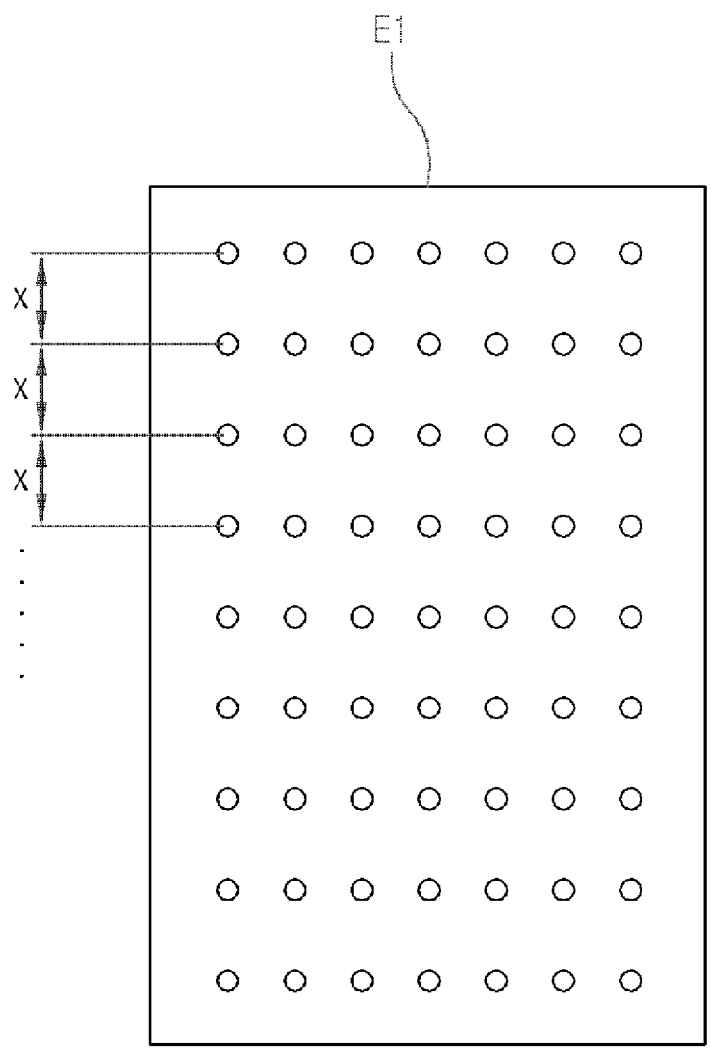

[Fig. 12]
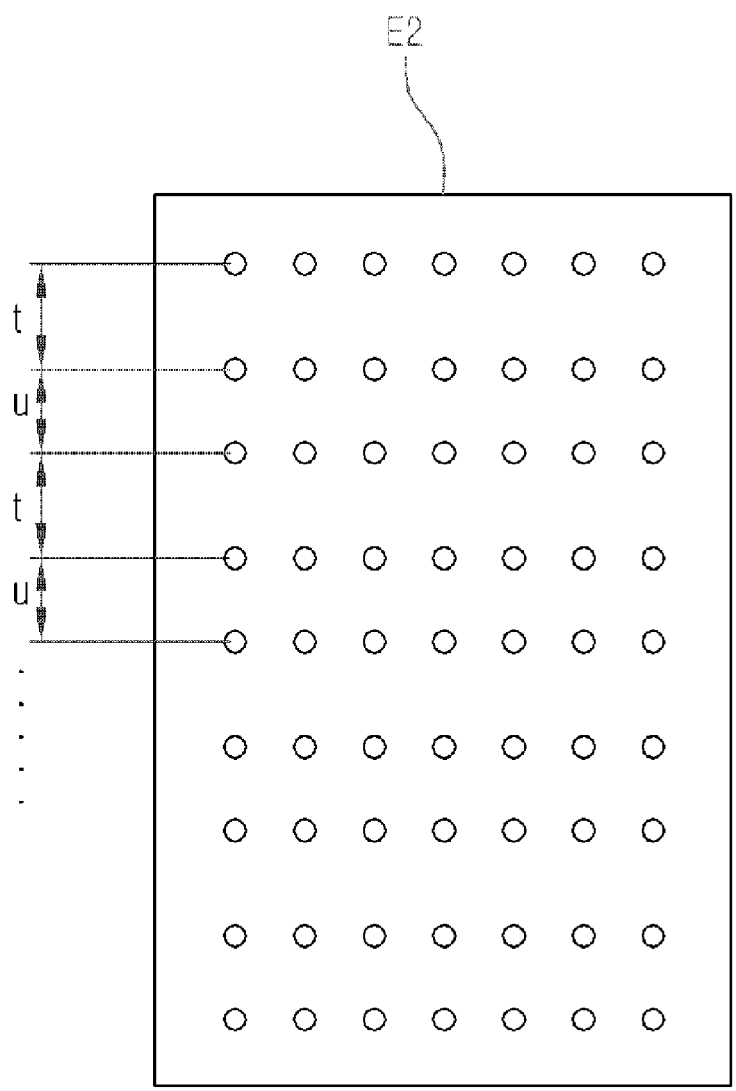

[Fig. 13]
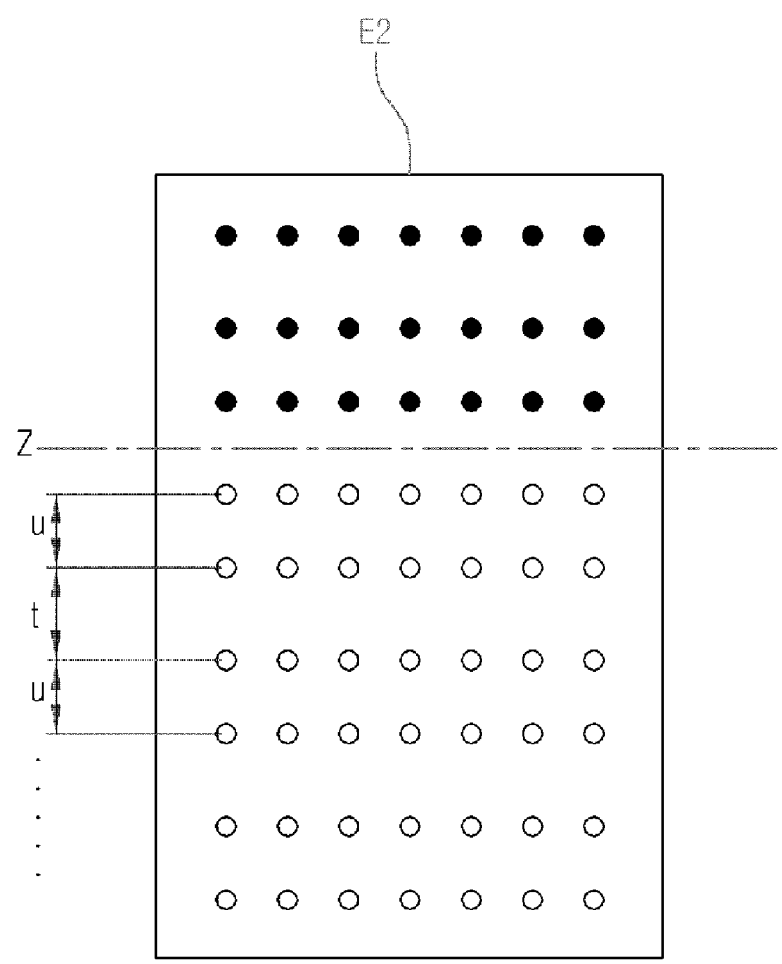

PICK-AND-PLACE APPARATUS

TECHNICAL FIELD

The present invention relates to a pick-and-place apparatus applicable to automatic equipment, such as a test handler, etc. More particularly, this invention relates to technology for regulating intervals between semiconductor devices when the semi-conductor devices are transferred between different elements on which the semi-conductor devices are loaded or arranged.

BACKGROUND ART

A test handler is equipment that loads semiconductor devices in customer trays, which are manufactured by a certain process, onto a test tray, supports a tester to test the semiconductor devices loaded on the test tray, sorts the semiconductor devices based on the test result, and then unloads the semiconductor devices in the test tray onto customer trays. The technology related to the test handler has been disclosed through many publications.

The semiconductor devices are, in general, loaded onto and stored on the customer tray. The customer tray is configured in such a way that intervals between columns and between rows of loaded semiconductor devices can be minimized such that the highest possible number of semiconductor devices can be loaded. As well, the test tray is configured in such a way that the loaded semiconductor devices can be arranged to have intervals for testing between columns and rows of the loaded semiconductor devices. That is, the intervals of the semiconductor devices on the test tray are greater than those of the semiconductor devices in the customer tray. Therefore, when the semiconductor devices are loaded from the customer trays onto the test tray or unloaded from the test tray onto the customer trays, the intervals of the semiconductor devices must be regulated.

Like the customer tray and the test tray, certain intervals of semiconductor devices are maintained by the following elements: an aligner or preciser included in the loading unit/unloading unit, a buffer for loading and storing remaining semiconductor devices, a moving-type loading table which was disclosed in the present applicant's prior Korean Patent application (Korean Patent Application No. 10-2006-0007763, entitled "TEST HANDLER AND LOADING METHOD THEREOF"), or a sorting table included in the unloading unit, etc.

The present invention is related to a pick-and-place apparatus that picks semi-conductor devices from any one of the above listed elements (a customer tray, a test tray, an aligner, a buffer, a moving-type loading table and a sorting table) and then safely places them onto another element. If the pick-and-place apparatus is included in a loading unit, it is called a loader or a loading hand. On the contrary, if the pick-and-place apparatus is included in an unloading unit, it is called an unloader or an unloading hand.

The pick-and-place apparatus, which has been known up to now, includes: 8 or 16 picking units, which are arranged in a 2×4, 1×8, or 2×8 matrix form, to pick up semi-conductor devices; and a widthwise interval regulation apparatus for changing and regulating the intervals of the picking units in the width direction; and/or a lengthwise interval regulation apparatus for changing and regulating the intervals of the picking units in the length direction respectively. Recently, the pick-and-place apparatus is configured to include picking units, arranged in 2×8 matrix form, as the picking units become small and light. Here, the picking units are configured in two rows in the pick-and-place apparatus to increase the number of semiconductor devices transferable at one time, thereby reducing the loading or unloading time. To transfer semiconductor devices between the above listed elements using such a pick-and-place apparatus having a structure of two rows, the intervals between the columns of the picking units (widthwise direction intervals, or column intervals) and the intervals between the rows of the picking units (lengthwise direction intervals, or row intervals) must be regulated, respectively.

The conventional interval regulation apparatus regulates the picking units such that picking units in one of the row picking units or the column picking units can all be aligned at the same interval. More specifically, referring to FIGS. 1A and 1B, the picking units 11 of two rows can be selectively arranged in a first state of FIG. 1A or in a second state of FIG. 1B by the operation of the interval regulation apparatus. That is, the interval between the rows of the picking units 11 in the first state is 'x' and the interval between the rows of the picking units 11 in the second state is 'u'. As such, the conventional interval regulation apparatus provides only two regulated states (the first and second states). That is, the conventional interval regulation apparatus can only maintain the intervals between adjacent rows of picking units as 'x' or 'u'. It is because the intervals between the rows of the semiconductor devices loaded on the customer tray are the same as 'x' and the intervals between the rows of the semiconductor devices loaded on the test tray are the same as 'u'. The foregoing is also applied in the interval between the columns of the picking units.

Meanwhile, in Korean Patent Application No. 10-2006-0003709 entitled "INSERT MODULE AND TEST TRAY FOR TEST HANDLER," which is hereinafter referred to as a conventional art, the present applicant has proposed a technology related to an insert module that receives (loads) two semiconductor devices. In the conventional art, the test tray has a multiplicity of insert modules that are arranged in a matrix form.

The following is a description of a test tray 200 disclosed in the conventional art, on the basis of only rows. As shown in FIG. 2, the test tray 200 installs the insert modules 201 thereon, which are arranged in the matrix form. Each insert module 201 is configured to load two semiconductor devices. Considering other factors, the semi-conductor devices received by the insert modules are preferably arranged being spaced apart from each other at different row intervals, 't' and 'u'. That is, the rows of the semi-conductor devices received by the same insert modules 201 are spaced apart from each other at an interval 't'. And, the rows of the semiconductor devices received by the adjacent insert modules 201 are spaced apart from each other at an interval 'u'.

Meanwhile, as shown in FIG. 3, the semiconductor devices are arranged in a customer tray 300 at the same interval 'x' between the rows thereof.

Therefore, when the conventional 2×8 pick-and-place apparatus transfers the semi-conductor devices from the customer tray 300 of FIG. 3 to the test tray 200 of FIG. 2, which is called as loading, or transfers the semiconductor devices from the test tray 200 to the customer tray 300, which is called as unloading, the intervals between the rows of semiconductor devices must be regulated. But, as described above, since the conventional pick-and-place apparatus must be subjected to restrictions in regulating the intervals between the rows of semiconductor devices, it cannot be maximally performed. Specifically, regarding loading, when the semiconductor devices are provided to, for example, the first and second rows of the test tray 200, the conventional 2×8 pick-and-place apparatus can place 16 semiconductor devices on the first and second rows at one time, however, when the semiconductor devices are provided to the second and third rows of the test tray 200, it firstly places 8 semiconductor devices on the second row and then 8 semiconductor devices on the third row. Therefore, the conventional pick-and-place apparatus is disadvantageous in that it requires a complicate control procedure and thus a time for transferring the semi-conductor devices is delayed.

DISCLOSURE OF INVENTION

Technical Problem

Therefore, the present invention has been made in view of the above problems, and it is an object of the present invention to provide a pick-and-place apparatus that can selectively regulate intervals between rows of picking units to any one of three or more values.

It is another object of the present invention to provide a pick-and-place apparatus performing any one of at least two or more regulations in such a way that at least one of the intervals between adjacent rows of picking units is different from at least one other of intervals between adjacent rows of picking units.

Technical Solution

In accordance with an aspect of the present invention, the above and other objects can be accomplished by the provision of a pick-and-place apparatus for transferring and loading semiconductor devices between a first loading element, on which semi-conductor devices are loaded at a first row interval, and a second loading element, on which the semiconductor devices are alternately loaded at second and third row intervals. The pick-and-place apparatus includes: a multiplicity of picking unit modules, each of which has at least one or more picking units; and an interval regulation apparatus for regulating intervals between the picking unit modules at first to third modes. The first to third row interval values are different from each other. The intervals between the picking unit modules are all regulated to be identical to the first row interval at the first mode. The intervals between the picking unit modules are alternately regulated to the second row interval and the third row interval in turn at the second mode. The intervals between the picking unit modules are alternately regulated to the third row interval and the second row interval in turn at the third mode.

Preferably, the interval regulation apparatus may include: a cam member for regulating the intervals between the picking unit modules; and a driving source for providing a driving force for the cam member.

Preferably, the cam member has a multiplicity of guide grooves which are slidably coupled to guide protrusions of the picking unit modules, respectively, and allow the guide protrusions to regulate their intervals along the guide grooves so that the intervals between the picking unit modules are changed.

Preferably, the cam member is shaped as a plate, and the driving source provides a driving force for translating the cam member.

In accordance with another aspect of the present invention, the above and other objects can be accomplished by the provision of a pick-and-place apparatus includes: a multiplicity of picking unit modules, each including a plurality of picking units aligned widthwise, in which the picking unit modules are arranged in a column; and a lengthwise interval regulation apparatus for regulating lengthwise intervals between the picking unit modules, wherein, the lengthwise interval regulation apparatus has at least three interval regulation modes.

Preferably, the pick-and-place apparatus may further comprising a widthwise interval regulation apparatus for regulating widthwise intervals between the picking units.

Preferably, the interval regulation apparatus may includes: a cam member for regulating the intervals between the picking unit modules; and a driving source for providing a driving force for the cam member.

Advantageous Effects

As apparent from the above description, the pick-and-place apparatus according to the present invention can transfer semiconductor devices, which are arranged in one element having different row intervals therein, to another element, such that it can efficiently transfer the semiconductor devices from a customer tray onto a test tray, in the loading, or transfer the semiconductor devices from the test tray onto a customer tray, in the unloading.

BRIEF DESCRIPTION OF THE DRAWINGS

The above and other objects, features and other advantages of the present invention will be more clearly understood from the following detailed description taken in conjunction with the accompanying drawings, in which:

FIGS. 1A and 1B are schematic views describing a conventional pick-and-place apparatus;

FIG. 2 is a schematic view illustrating a conventional test tray according to the present applicant's prior application;

FIG. 3 is a schematic view illustrating a general customer tray;

FIG. 4 is a perspective view illustrating an embodiment of a pick-and-place apparatus according to the present invention;

FIGS. 5 to 7 are side views when the pick-and-place apparatus of FIG. 4 is operated;

FIG. 8 is a perspective view illustrating a second embodiment of the pick-and-place apparatus according to the present invention;

FIG. 9 is a view illustrating guide grooves of a cylindrical cam applied to the pick-and-place apparatus of FIG. 8;

FIG. 10 is a perspective view illustrating a third embodiment of the pick-and-place apparatus according to the present invention; and FIGS. 11 to 13 are schematic views illustrating an element loading or arranging semiconductor devices, which is referred to describe the pick-and-place apparatus of FIG. 4.

BRIEF DESCRIPTION OF SYMBOLS IN THE DRAWINGS

450: pick-and-place apparatus
41: picking unit
42: guide protrusion
43: rail groove
50: interval regulation apparatus
51: installation plate
52*a*: back plate
52*b*: front plate
53: cylinder
54: cam plate
55*a*, 55*b*: sliding rail
56*a*, 56*b*: sliding member
57: guide rail

BEST MODE FOR CARRYING OUT THE INVENTION

Preferred embodiments according to a pick-and-place apparatus of the present invention will be described in detail with reference to the accompanying drawings. In the following description, a detailed description of known functions and configurations incorporated herein will be omitted when it may make the subject matter of the present invention rather unclear.

FIG. 4 is a perspective view illustrating an embodiment of a pick-and-place apparatus according to the present invention.

As shown in FIG. 4, the pick-and-place apparatus 450 includes picking unit modules 40, which are arranged side by side in a lengthwise direction, and an interval regulation apparatus 50.

Each picking unit module 40 is configured to include 8 picking units 41 aligned widthwise. For example, four picking unit modules 40 have picking units 41 arranged in 4×8 matrix form. More specifically, the 8 picking units 41 are arranged in each of four rows, and the 8 picking units 41 in a row are integrally formed as a module such that they can move in the lengthwise direction. As well, each picking unit module 40 forms a guide protrusion 42 at its one end (left end with respect to FIG. 4) and a rail groove 43 at its opposite end (right end with respect to FIG. 4).

The interval regulation apparatus 50 is configured to include an installation plate 51, back and front plates 52a and 52b which form a pair, a cylinder 53, a cam plate 54, a pair of sliding rails 55a and 55b, a pair of sliding members 56a and 56b, and a guide rail 57.

The installation plate 51 is positioned at the left with respect to the picking units 41 (or the left of the picking unit modules 40). The installation plate 51 is configured to support the back and front plates 52a and 52b, cylinder 53, cam plate 54, the pair of sliding rails 55a 55b, the pair of sliding members 56a and 56b, and guide rail 57, which are installed onto the installation plate 51.

The back and front plates 52a and 52b are installed along the row of the picking units 41 at the back and front ends of the installation plate 51, respectively, in such a way that their one ends are fixed to the installation plate 51 and their opposite ends are coupled to the guide rail 57.

The cylinder 53 is included as a driving source that provides a driving force to move the cam plate 54 up and down. In stead of the cylinder 53, the embodiment may be modified in such a way that the cam plate 54 can be moved up and down by a motor and/or a gear apparatus.

The cam plate 54 is installed to be parallel to the installation plate 51. The cam plate 54 moves up and down according to the operation of the cylinder 53 to regulate the intervals of the picking unit modules 40. The cam plate 54 has guide grooves 54a, 54b, 54c, and 54d thereon, corresponding to the number of picking unit modules 40, for example, four. The guide grooves 54a, 54b, 54c, and 54d are formed lengthwise, approximately up and down, on the cam plate 54. These guide grooves 54a, 54b, 54c, and 54d are slidably coupled to the guide protrusions 42, respectively. Such guide grooves 54a, 54b, 54c, and 54d are illustrated in more detail in FIG. 5, seen from the left of the pick-and-place apparatus of FIG. 4.

Referring to FIG. 5, the guide grooves 54a, 54b, 54c, and 54d are formed on the cam plate in such a way that their intervals can be minimized at line B indicating the center horizontal line of the cam plate 51 and widened as horizontal lines, such as A and C, are increasingly further apart from the line B. Here, the lines A, B, C are defined as a 'regulation state maintaining line' for a convenient description, since the intervals between the guide protrusions 42 (or the picking unit modules 40) are changed according to whether the guide protrusions 42 (or the picking unit modules 40) are located at and maintained along the guide grooves 54a, 54b, 54c, and 54d.

More specifically, as shown in FIG. 5, the intervals between adjacent guide grooves are changed according to the lines A, B, and C. That is, the intervals between the adjacent guide grooves denoted by, for example, 54a and 54b are different as follows, 't' with respect to line A (referred to as a second interval), 'x' with respect to line B (referred to as a first interval), and 'u' with respect to line C (referred to as a third interval). As well, the intervals between the adjacent guide grooves 54b and 54c are 'u,' 'x,' and 't' with respect to lines A, B, and C, respectively. In addition, the intervals between the adjacent guide grooves 54c and 54d are 't,' 'x,' and 'u' with respect to lines A, B, and C, respectively. Therefore, when the guide protrusions 42 are positioned at line A, the picking unit modules 40 maintain their intervals, t, u, and t in their row direction. As well, when the guide protrusions 42 are positioned at line B, the picking unit modules 40 maintain their intervals, x, x, and x in their row direction. In addition, when the guide protrusions 42 are positioned at line C, the picking unit modules 40 maintain their intervals, u, t, and u in their row direction.

Meanwhile, the pair of sliding rails 55a and 55b, between which the cam plate 54 is located, are installed at both end portions of the installation plate 51, up and down.

The pair of sliding members 56a and 56b are slidably coupled to the pair of sliding rails 55a and 55b such that they can move up and down along the sliding rails 55a and 55b. The one end of each of the sliding member 56a and 56b is fixed to the cam plate 54. Another end of the front position sliding member 56b is coupled to a piston rod 53a of the cylinder 53. Therefore, when the cylinder 53 is operated, the pair of sliding members 56a and 56b are slid up and down along the pair of sliding rails 55a and 55b, and thus the cam plate 54 coupled to the sliding members 56a and 56b is also moved up and down.

Referring to FIG. 4 again, the guide rail 57 is coupled, in both its opposite ends, to another ends of the back and front plates 52a and 52b, respectively. Also, the guide rail 57 is slidably coupled to the rail grooves 43, formed at the end portions (right) of the respective picking unit modules 40, to allow the right of the picking unit modules 43 to slidably move therealong (back and forth).

The following is a description of operations of the pick-and-place apparatus 450 configured as described above, with reference to FIGS. 5 to 7 together with FIGS. 11 to 13.

FIG. 11 and FIG. 12 (or FIG. 13) illustrate a first element E1, in which loaded semi-conductor devices has a row interval x, and a second element E2, in which loaded semiconductor devices has alternately row intervals t and u in turn such as t, u, t, u, . . . , from the elements, in which semiconductor devices are loaded and arranged (such as a customer tray, a test tray, a moving type loading table, an aligner, a buffer, and a sorting table, etc). It is assumed that the intervals between their columns are the same for a convenient description. Here, the first element E1 shown in FIG. 11 may be regarded as, for example, a customer tray, a sorting table, etc., and the second element E2 shown in FIGS. 12 and 13 may be regarded as, for example, a test tray, a moving type loading table, and an aligner, etc.

Firstly, transferring semiconductor devices from the first element E1 to the second element E2 is performed as follow:

Since the intervals between the picking unit modules 40 must be the same as 'x', the picking unit modules 40 picks up semiconductor devices from the first element E1 in a state illustrated in FIG. 5, i.e., where the interval regulation apparatus 50 maintains a regulation state at a first mode, in which the guide protrusions 42 which are correspondingly positioned at the guide grooves 54a, 54b, 54c, and 54d are aligned on line B, respectively. After that, the cylinder 53 is operated to allow the cam plate 54 to move down such that the interval regulation apparatus 50 can be operated while the pick-and-place apparatus is moving to the second element E2 by a moving apparatus (not shown; for example, an X-Y robot) and the interval regulation apparatus 50 can enter a regulation state at a second mode. Then, the guide protrusions 42 are positioned at line A. Next, the semiconductor devices are safely placed on the second element E2.

As well, as shown in FIG. 13, if semiconductor devices were already loaded on the rows up to the line Z of the second element E2, other semiconductor devices will also be placed on the rows below line Z of the second element E2. That is, the semi-conductor devices need to be placed on the element at the intervals, u, t, and u, instead of intervals, t, u, and t. In that case, the interval regulation apparatus 50 maintains the regulation state at the first mode and picks the semiconductor devices from the first element E1. The cylinder 53 is operated to allow the cam plate 54 to move up such that the interval regulation apparatus 50 can enter a regulation state at a third mode while the pick-and-place apparatus is moving to the second element E2. Then, the guide protrusions 42 are positioned at line C. Next, the semiconductor devices are safely placed on the second element E2.

Meanwhile, transferring semiconductor devices from the second element E2 to the first element E1 is performed as follows:

If the semiconductor devices are maintained at the intervals, t, u, and t, they are picked up in a state of FIG. 6. After that, the intervals of the semiconductor devices are changed to the state of FIG. 5 while they are transferred to the first element E1 and then placed on the first element E1. If semiconductor devices are maintained at the intervals u, t, and u, they are picked up in a state of FIG. 7. After that, the intervals of the semiconductor devices are changed to the state of FIG. 5 while they are transferred to the first element E1 and then placed on the first element E1.

In the embodiment of the present invention as described above, although it uses the cam plate 54 as a cam member, the cam member may be implemented by a cylindrical cam 84 as shown in FIG. 8. As well, even though the embodiment of the present invention uses the cylinder 53 as a driving source, the driving source may be implemented by a motor 83 or a gear apparatus, as shown in FIG. 8. FIG. 9 is a plane view illustrating guide grooves formed on the cylindrical cam 84 of FIG. 8.

Also, in the embodiment of the present invention as described above, although the cam plate 54 has the guide grooves formed thereon in such a way that the intervals between adjacent guide grooves on the line B are increasingly widened as the guide grooves are run to lines A and C which are positioned at both sides with respect to line B, and spaced apart from the line B, it can be modified to form guide grooves in such a way that the intervals between the adjacent guide grooves, as shown in FIG. 10, may be increasingly widened from one end of the cam plate, or a line D in which the intervals are minimized, to another end. Here, considering moving distance of the cam plate, the cam plate 54 of the embodiment of FIG. 4 is more preferable than that of FIG. 10.

In addition, in the embodiment of the present invention as described above, although it is described based on only four rows of picking unit modules (four picking unit modules), the embodiment may be modified to include more or fewer rows of picking unit modules. For example, the embodiment can be configured to include two rows of picking unit modules. In that case, the cam plate may have only two guide grooves corresponding to the two rows of the picking unit modules, and thus only one interval exists between the adjacent grooves. Although the cam plate has two guide grooves and one interval, the interval must be formed to have three intervals (distances), x, t, and u, at three regulation state maintaining lines. Therefore, the interval between the two guide grooves can be selectively regulated by one of the three regulation values.

Further, in the embodiment of the present invention as described above, although it is described by regulating only the intervals between rows of the picking units 41 as the picking units 41 of each row are integrally formed as a module, it may be modified by regulating only intervals between columns of the picking units 41. As well, the embodiment may be modified to independently regulate the intervals between the rows of the picking units arranged in the matrix form and between the columns of the picking units in the matrix form. In that case, the pick-and-place apparatus may be implemented in such a way that the intervals between the rows of the picking units or between the columns of the picking units in the matrix form may be regulated by the interval regulation apparatus of FIG. 5 and opposite intervals may be regulated by a conventional interval regulation apparatus. Additionally, the pick-and-place apparatus may be implemented in such a way that both of the intervals between the rows and between columns of the picking units in the matrix form can be regulated by the interval regulation apparatuses of FIG. 4.

Furthermore, the embodiment of the present invention can be implemented by picking units arranged in only two rows. In that case, the embodiment can be controlled based on three or more regulation state values, by using a cylinder that can allow the interval between rows of picking units to be three or more certain operation distances or using a step motor that can allow the interval to be three or more certain rotation distances.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

As described above, the pick-and-place apparatus according to the present invention transfers semiconductor devices between the test tray and customer tray while selectively regulating the intervals of picking units for picking the semiconductors. Therefore, the pick-and-place apparatus can operate with high efficiency and thus can be widely used in the semiconductor equipment.

The invention claimed is:

1. A pick-and-place apparatus for transferring and loading semiconductor devices between a first loading element, on which semiconductor devices are loaded at a first row interval, and a second loading element, on which the semiconductor devices are alternately loaded at second and third row intervals, the pick-and-place apparatus comprising:

a multiplicity of picking unit modules, each of which has at least one or more picking units; and an interval regulation apparatus for regulating intervals between the picking unit modules at first, second, and third modes, wherein, the interval values of the first, second, and third rows are different from each other;

the intervals between the picking unit modules are all regulated to be identical to the first row interval at the first mode;

the intervals between the picking unit modules are alternately regulated to the second row interval and the third row interval in turn at the second mode; and the intervals between the picking unit modules are alternately regulated to the third row interval and the second row interval in turn at the third mode.

2. The pick-and-place apparatus according to claim 1, wherein the interval regulation apparatus comprises:

a cam member for regulating the intervals between the picking unit modules; and a driving source for providing a driving force for the cam member.

3. The pick-and-place apparatus according to claim 2, wherein the cam member has a plurality of guide grooves which are slidably coupled to guide protrusions of the picking unit modules, respectively, and allow the guide protrusions to regulate their intervals along the guide grooves so that the intervals between the picking unit modules are changed.

4. The pick-and-place apparatus according to claim 3, wherein:

the cam member is shaped as a plate; and the driving source provides a driving force for translating the cam member.

5. A pick-and-place apparatus for transferring and loading semiconductor devices between a first loading element, on which semiconductor devices are regularly loaded at a first row interval, and a second loading element, on which the semiconductor devices are loaded at a second row interval, the pick-and-place apparatus comprising:

a multiplicity of picking unit modules, each of which has at least one or more picking units; and an interval regulation apparatus for regulating intervals between the picking unit modules to a pitch of the first loading element at a first mode or to a pitch of the second loading element at a second mode, wherein:

the first row interval value of the first loading element or the second row interval value of the second loading element is different from each other;

the intervals between the picking unit modules are regulated to be identical to the first row interval, whose pitches are all aligned in the same distance, at the first mode; and the intervals between the picking unit modules are regulated to the second row interval, whose pitches are differently aligned, at the second mode.

6. A pick-and-place apparatus for transferring and loading semiconductor devices between a first loading element, on which semiconductor devices are regularly loaded at a first row interval, and a second loading element, on which the semiconductor devices are loaded at a second row interval, the pick-and-place apparatus comprising:

a multiplicity of picking unit modules, each of which has at least one or more picking units; and an interval regulation apparatus for regulating intervals between the picking unit modules to a pitch of the first loading element at a first mode or to a pitch of the second loading element at a second mode, wherein:

the first row interval value of the first loading element or the second row interval value of the second loading element is different from each other;

the intervals between the picking unit modules are regulated to be identical to the first row interval, whose pitches are all aligned in the same distance, at the first mode; and the intervals between the picking unit modules are repeatedly regulated to the second row interval, whose pitches are two types and alternately aligned, at the second mode.

* * * * *